US006987295B2

(12) United States Patent
Sell et al.

(10) Patent No.: US 6,987,295 B2
(45) Date of Patent: Jan. 17, 2006

(54) TRENCH CAPACITOR AND METHOD FOR FABRICATING THE TRENCH CAPACITOR

(75) Inventors: Bernhard Sell, Portland, OR (US); Annette Sänger, Dresden (DE); Dirk Schumann, Schönfliess (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/650,817

(22) Filed: Aug. 28, 2003

(65) Prior Publication Data

US 2004/0036102 A1 Feb. 26, 2004

Related U.S. Application Data

(63) Continuation of application No. PCT/DE02/00515, filed on Feb. 13, 2002.

(30) Foreign Application Priority Data

Feb. 28, 2001 (DE) ................................ 101 09 564

(51) Int. Cl.
*H01L 27/108* (2006.01)

(52) U.S. Cl. ....................................... 257/301; 257/304

(58) Field of Classification Search ................ 257/301, 257/304, 532

See application file for complete search history.

(56) References Cited

U.S. PATENT DOCUMENTS

| | | | | |
|---|---|---|---|---|
| 5,905,279 A | | 5/1999 | Nitayama et al. | |
| 6,180,480 B1 | | 1/2001 | Economikos et al. | |
| 6,194,755 B1 | * | 2/2001 | Gambino et al. | 257/301 |
| 6,258,689 B1 | * | 7/2001 | Bronner et al. | 438/386 |
| 6,359,300 B1 | * | 3/2002 | Economikos et al. | 257/301 |
| 6,781,180 B1 | * | 8/2004 | Martin et al. | 257/301 |
| 2004/0036102 A1 | * | 2/2004 | Sell et al. | 257/301 |

FOREIGN PATENT DOCUMENTS

| | | |
|---|---|---|
| EP | 0 967 643 A2 | 12/1999 |
| EP | 0 981 164 A2 | 2/2000 |
| WO | 01/17014 A1 | 3/2001 |

OTHER PUBLICATIONS

The American Heritage Dictionary, Second College Edition, p. 867, plain meaning definition of "on", 1982.*

Yamada, K. et al.: "Deep-Trenched Capacitor Technology for 4 Mega Bit Dynamic RAM", IEEE, 1985, pp. 702-705.

* cited by examiner

*Primary Examiner*—Mark V. Prenty
(74) *Attorney, Agent, or Firm*—Laurence A. Greenberg; Werner H. Stemer; Ralph E. Locher

(57) ABSTRACT

A trench capacitor for use in a DRAM memory cell contains a lower capacitor electrode, a storage dielectric, and an upper capacitor electrode, which are at least partially disposed in a trench. The lower capacitor electrode adjoins, in a lower trench region, a wall of the trench, while in the upper trench region there is a spacer layer that adjoins a wall of the trench and is made from an insulating material. The upper electrode contains at least three layers, a first layer disposed in the trench on the storage dielectric and containing doped polysilicon, a second layer disposed on the first layer and containing metal-silicide, and a third layer disposed on the second layer and containing doped polysilicon. The layers of the upper electrode in each case extending along the walls and the base of the trench up to at least the upper edge of the spacer layer.

9 Claims, 8 Drawing Sheets

TRENCH CAPACITOR AND METHOD FOR FABRICATING THE TRENCH CAPACITOR

CROSS-REFERENCE TO RELATED APPLICATION

This application is a continuation of copending International Application No. PCT/DE02/00515, filed Feb. 13, 2002, which designated the United States and was not published in English.

BACKGROUND OF THE INVENTION

Field of the Invention

The present invention relates to a trench capacitor for use in a DRAM memory cell and to a method for fabricating a trench capacitor of this type. The invention also relates to a memory cell having a select transistor and a trench capacitor of this type and to a method for fabricating a memory cell of this type.

In dynamic random access memory cell configurations, there is the virtually exclusive use of single transistor memory cells. A single transistor memory cell contains a read transistor and a storage capacitor. The information is stored in the storage capacitor in the form of an electric charge that represents a logic 0 or a logic 1. Actuating the read transistor via a word line allows the information to be read via a bit line.

The storage capacitor must have a minimum capacitance for reliable storage of the charge and, at the same time, to make it possible to differentiate the information item that has been read. The lower limit for the capacitance of the storage capacitor is currently considered to be 25 fF.

Since the storage density increases from memory generation to memory generation, the surface area required by the single-transistor memory cell must be reduced from generation to generation. At the same time, the minimum capacitance of the storage capacitor has to be retained.

Up to the 1 Mbit generation, both the read transistor and the storage capacitor have been produced as planar components. Beyond the 4 Mbit memory generation, the area taken up by the memory cell was reduced further by using a three-dimensional configuration of the read transistor and the storage capacitor. One possibility is for the storage capacitor to be produced in a trench (see for example the reference by K. Yamada et al., Proc. Intern. Electronic Devices and Materials IEDM 85, pp. 702 ff.). In this case, a diffusion region that adjoins the wall of the trench and a doped polysilicon filling disposed in the trench act as electrodes for the storage capacitor. Therefore, the electrodes of the storage capacitor are disposed along the surface of the trench. In this way, the effective surface area of the storage capacitor, on which the capacitance is dependent, is increased with respect to the space taken up by the storage capacitor on the surface of the substrate, which corresponds to the cross section of the trench. Reducing the cross section of the trench enables the packing density to be increased further. However, limits are imposed on the extent to which the depth of the trench can be increased, for technological reasons.

U.S. Pat. No. 5,905,279 discloses a memory cell having a storage capacitor disposed in a trench and a select transistor. The storage capacitor has a lower capacitor electrode, which adjoins a wall of the trench, a capacitor dielectric and an upper capacitor electrode. The upper capacitor electrode contains a layer stack containing polysilicon, a conductive layer, in particular containing WSi, TiSi, W, Ti or TiN, and polysilicon. The trench capacitor is fabricated by first forming a lower capacitor electrode in the lower trench region. Then, an insulating collar is deposited in the upper trench region, and next the upper capacitor electrode is completed. Alternatively, the method is carried out on an SOI substrate which does not have an insulating collar, in which case the upper capacitor electrode, which contains a lower polysilicon layer and a tungsten silicide filling, is produced in a single-stage deposition process in which the individual layers are deposited entirely in the trench.

U.S. Pat. No. 6,180,480 describes a trench capacitor for use in a DRAM memory cell. The upper capacitor electrode of which is formed of a buffer layer, which may, for example be of amorphous silicon, polysilicon, germanium, or SiGe, a metal layer, which may, for example, be of tungsten and with a filling material of germanium or an SiGe-alloy with a germanium portion of at least 33%. After formation of the insulation collar and separation of the dielectric layer, the layers of the upper capacitor electrode are applied over the entire surface so that they extend to the upper end of the insulation collar.

Published, European Patent Application EP 0 981 164 A discloses a trench capacitor for use in a DRAM memory cell, the upper capacitor electrode of which contains a lower layer of doped polysilicon and an upper layer of metal nitride.

SUMMARY OF THE INVENTION

It is accordingly an object of the invention to provide a trench capacitor and a method for fabricating the trench capacitor that overcome the above-mentioned disadvantages of the prior art devices and methods of this general type, in which trench capacitor, the upper electrode contains at least two layers, of which at least one is metallic, which can be fabricated using a simplified method.

With the foregoing and other objects in view there is provided, in accordance with the invention, a trench capacitor for use in a DRAM memory cell. The trench capacitor contains a substrate having a substrate surface and a trench formed therein. The trench having a lower trench region, an upper trench region, a base, and walls. A lower capacitor electrode adjoins, in the lower trench region, one of the walls of the trench. A storage dielectric is disposed at least partially in the trench. A spacer layer is disposed in the upper trench region, the spacer layer adjoins one of the walls of the trench and is made from an insulating material. An upper capacitor electrode is disposed at least partially in the trench. The upper electrode is formed from at least two layers, the layers in each case extending along the walls and the base of the trench to at least an upper edge of the spacer layer. The layers include a metal-silicide layer and a polysilicon layer.

According to the present invention, the object is achieved by a trench capacitor for use in a DRAM memory cell, having a lower capacitor electrode, a storage dielectric and an upper capacitor electrode, which are disposed at least partially in a trench. The lower capacitor electrode adjoins, in the lower trench region, a wall of the trench, while in the upper trench region there is a spacer layer that adjoins a wall of the trench and is made from an insulating material. The upper electrode contains at least three layers, a first layer disposed in the trench on the storage dielectric and containing doped polysilicon, a second layer disposed on the first layer and containing metal-silicide, and a third layer disposed on the second layer and containing doped polysilicon. The layers of the upper electrode in each case extending along the walls and the base of the trench up to at least the upper edge of the spacer layer and the uppermost layer of the upper electrode is doped polysilicon.

The present invention also provides a memory cell having a storage capacitor as defined above and a select transistor, which contains a source electrode, a drain electrode, a gate electrode and a conductive channel. The upper capacitor electrode is connected in an electrically conductive manner to the source or drain electrode.

Furthermore, the present invention provides a method for fabricating a memory cell using the steps of the method for fabricating a storage capacitor as defined above and the steps of forming a source electrode, a drain electrode, a gate electrode and a conductive channel, with the result that the select transistor is fabricated. The upper capacitor electrode is connected in an electrically conductive manner to the source or drain electrode.

The upper capacitor electrode of the trench capacitor according to the invention therefore contains a plurality of layers, of which at least one is metallic. In this case, the layers extend along the base and the walls of the trench, i.e. are deposited in a trench-conformal manner. The invention is substantially based on first forming the insulating collar in the upper trench region and then forming the lower capacitor electrode, the storage dielectric and the upper capacitor electrode. This allows the fabrication method to be simplified considerably, since the steps for etching back the upper capacitor electrode to allow the insulating collar to be formed are dispensed with, and the upper capacitor electrode can be deposited substantially in a single stage.

Accordingly, the upper capacitor electrode extends at least as far as the upper edge of the insulating collar.

If a silicon substrate is used, the deposited insulating collar is responsible for disconnecting a parasitic transistor in the finished memory cell. On the other hand, if an SOI substrate is used, the insulating collar that in this case is deposited with a reduced thickness is responsible for providing a diffusion barrier during the subsequent doping steps.

The present invention provides the now described advantages.

The method according to the invention for fabricating the trench capacitor is less expensive than the method that is known from U.S. Pat. No. 5,905,279, since the steps of etching back the upper capacitor electrode are eliminated.

The method according to the invention can advantageously be realized using numerous dielectrics, for example silicon oxynitride, $Al_2O_3$, $ZrO_2$, $TiO_2$ and further dielectrics that are well known to the person skilled in the art.

The method according to the invention can easily be combined with measures for increasing the surface area, such as for example the HSG method (roughening of the silicon surface, hemispherical graining) or mesopore etching.

Particularly when using the method according to the invention, it is possible to widen the lower part of the capacitor trench, so that the capacitance of the capacitor is increased.

Since the upper capacitor electrode contains a metallic layer which, together with the other layers, extends along the walls of the capacitor at least as far as the upper edge of the spacer layer and is therefore formed integrally, the upper capacitor electrode has a lower resistance than that which is known from U.S. Pat. No. 5,905,279.

The subsequent doping of the lower part of the substrate, with the result that the depletion zone is reduced and if appropriate the lower capacitor electrode is produced, is advantageous compared to the use of a substrate which has already been doped in the lower region, since substrates of this type are more expensive and may be more difficult to obtain, and in particular since the dopant concentration therein is predetermined (typically $10^{17}$ $cm^{-3}$) and too low for the formation of the lower capacitor electrode.

The use of a metallic layer in the upper capacitor electrode on the one hand, on account of the reduced depletion zone, allows the capacitance of the capacitor to be increased, and on the other hand leads to the production of a low-resistance upper capacitor electrode, allowing in particular a rapid read time of the storage capacitor to be achieved.

If the upper capacitor electrode contains a polysilicon layer, the development outlay for the electrode concept is low.

If a polysilicon layer is disposed between the capacitor dielectric and the metallic layer, it is in this way possible to minimize the stress between capacitor dielectric and metallic layer.

The present concept can be combined with any desired configurations of the lower electrode.

In accordance with an added feature of the invention, the spacer layer has a thickness in a direction parallel to the substrate surface to be 15 to 25 nm. Preferably, the spacer layer has a thickness is 3 to 7 nm.

In accordance with another feature of the invention, the spacer layer is disposed in an upper third to an upper fifth of the trench and does not extend as far as the substrate surface.

In accordance with a further feature of the invention, the metal-silicide layer contains a silicide compound, a nitride compound, a carbon compound or a silicon/nitrogen compound of a metal, and a metal being tungsten, titanium, molybdenum, tantanium, cobalt, nickel, niobium, platinum, palladium or the rare earths.

Other features which are considered as characteristic for the invention are set forth in the appended claims.

Although the invention is illustrated and described herein as embodied in a trench capacitor and a method for fabricating the trench capacitor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
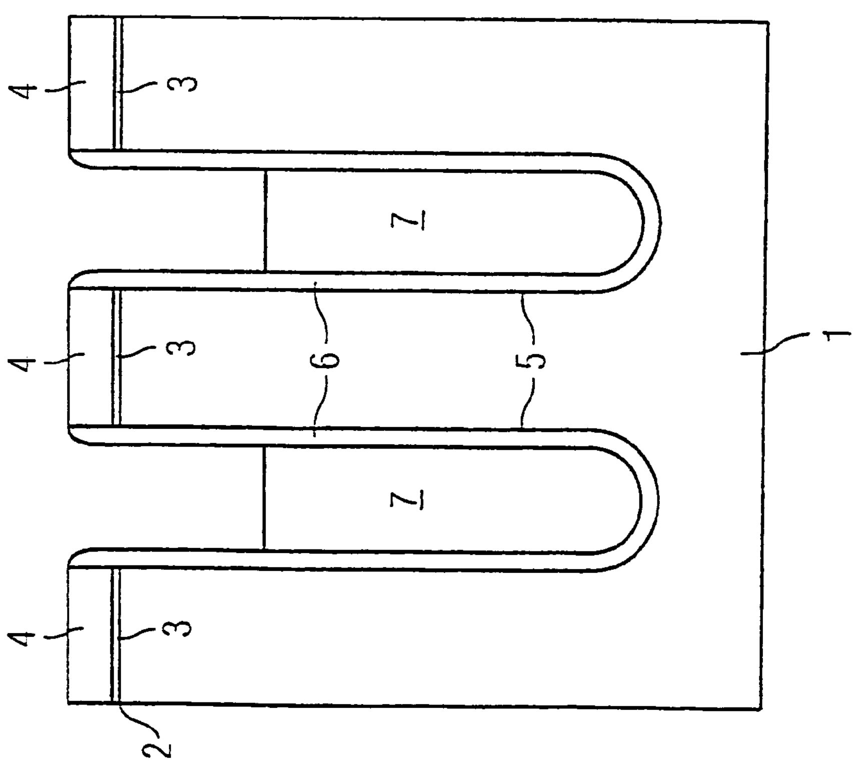
FIG. 1 to FIG. 7 are diagrammatic, sectional views showing the steps involved in fabricating a trench capacitor and of a memory cell in accordance with a first embodiment of the invention.

Referring now to the figures of the drawing in detail and first, particularly, to FIG. 1 thereof, there is shown a silicon substrate 1 with a main surface 2. A 5 nm thick $SiO_2$ layer 3 and a 200 nm thick $Si_3N_4$ layer 4 are applied to the main surface 2. Then, a 1,000 nm thick non-illustrated BSG layer is applied as a hard mask material.

Using the non-illustrated mask produced by photolithograpy, the BSG layer, the $Si_3N_4$ layer 4 and the $SiO_2$ layer 3 are patterned in a plasma etching process using $CF_4/CHF_3$, so that a hard mask is formed. After removal of the mask produced by photolithography, trenches 5 are etched into the main surface 2 in a further plasma etching process using $HBr/NF_3$ and the hard mask as an etching mask. Then, the BSG layer is removed by a wet etch using $H_2SO_4/HF$.

The depth of the trenches 5 is, for example, 5 μm, their width is 100×250 nm and they are spaced apart from one another by 100 nm.

Next, a 10 nm thick $SiO_2$ layer 6, which may also be doped, for example by in-situ doping, is deposited. The deposited $SiO_2$ layer 6 covers at least the wall of the trenches 5. Deposition of a 200 nm thick polysilicon layer 7, chemical mechanical polishing down to the surface of the $Si_3N_4$ layer 4 and etching back of the polysilicon layer 7 using $SF_6$ results in a polysilicon filling 7 being produced in each of the trenches 5, the surface of the polysilicon filling 7 is disposed 1,000 nm below the main surface 2 (see FIG. 1). If appropriate, the chemical mechanical polishing can be dispensed with. The polysilicon filling 7 is used as a sacrificial layer for the subsequent $Si_3N_4$ spacer deposition. Next, the $SiO_2$ layer 6 on the walls of the trenches 5 is etched isotropically.

Then, a CVD process is used to deposit a 20 nm thick spacer layer 9, which contains silicon nitride and/or silicon dioxide, and the spacer layer 9 is then etched in an anisotropic plasma etching process using $CHF_3$. The spacer layer 9 that has just been deposited is used, in the finished memory cell, to disconnect the parasitic transistor that would otherwise form at this location, and therefore forms an insulating collar 9.

Figure 2:
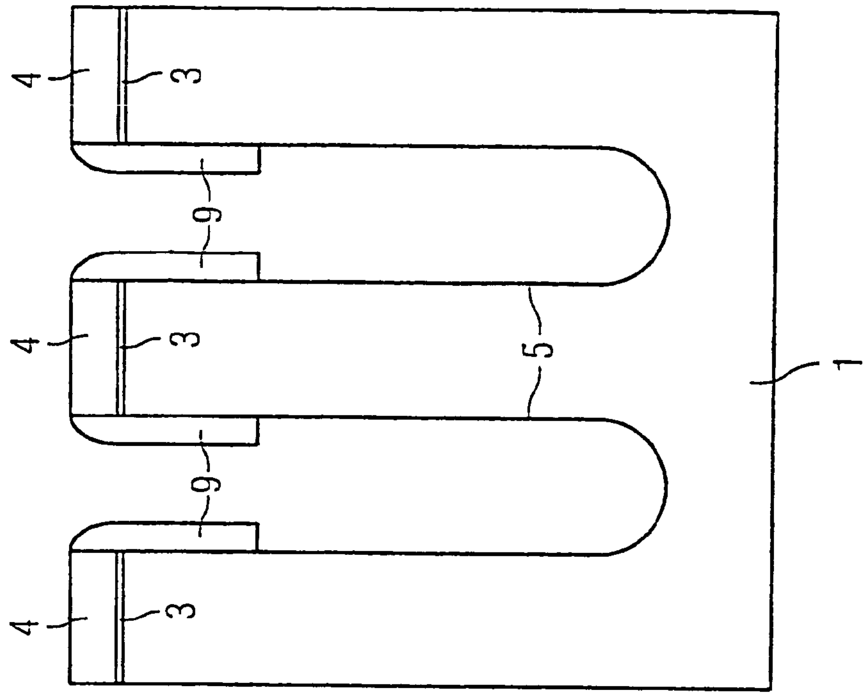

Then, $SF_6$ is used to etch polysilicon selectively with respect to $Si_3N_4$ and $SiO_2$. In the process, the polysilicorn filling 7 is in each case removed completely from the trench 5. That part of the $SiO_2$ layer 6 that has now been uncovered is removed by etching using $NH_4F/HF$ (see FIG. 2).

If appropriate, to widen the trenches 5 in their lower region, i.e. in the region remote from the main surface 2, silicon is then etched selectively with respect to the spacer layer 9. This is affected, for example, by use of an isotropic etching step using ammonia, in which silicon is etched selectively with respect to $Si_3N_4$. The etching time is such that 20 nm of silicon are etched. In this way, the cross section is widened by 40 nm in the lower region of the trenches 5. As a result, the capacitor area and therefore the capacitance of the capacitor can be increased further. The collar may also be produced by other processes, such as for example local oxidation (LOCOS) or collar formation during the trench etching.

The drawings illustrate the process sequence with unwidened trenches.

Then, if this has not already been affected by the doped oxide, the silicon substrate is doped. This can be achieved, for example, by depositing an arsenic-doped silicate glass layer in a layer thickness of 50 nm and a TEOS-$SiO_2$ layer in a thickness of 20 nm, followed by a heat treatment step at 1,000° C., for 120 seconds, with the result that, as a result of diffusion out of the arsenic-doped silicate glass layer, an $n^+$-doped region 10 is formed in the silicon substrate 1. Alternatively, it is also possible to carry out vapor-phase doping, for example using the following parameters: 900° C., 399 Pa tributylarsine (TBA) (33 per cent), 12 minutes.

A first object of the $n^+$-doped region is to reduce the size of the depletion zone, so that the capacitance of the capacitor is increased further. Second, the high doping concentration, which is of the order of magnitude of $10^{19}$ $cm^{-3}$, allows the lower capacitor electrode to be provided, if it is not to be metallic. If it is metallic, the high level of doping produces an ohmic contact. The required doping for the ohmic contact is approximately $5\times10^{19}$ $cm^{-3}$.

Figure 3:
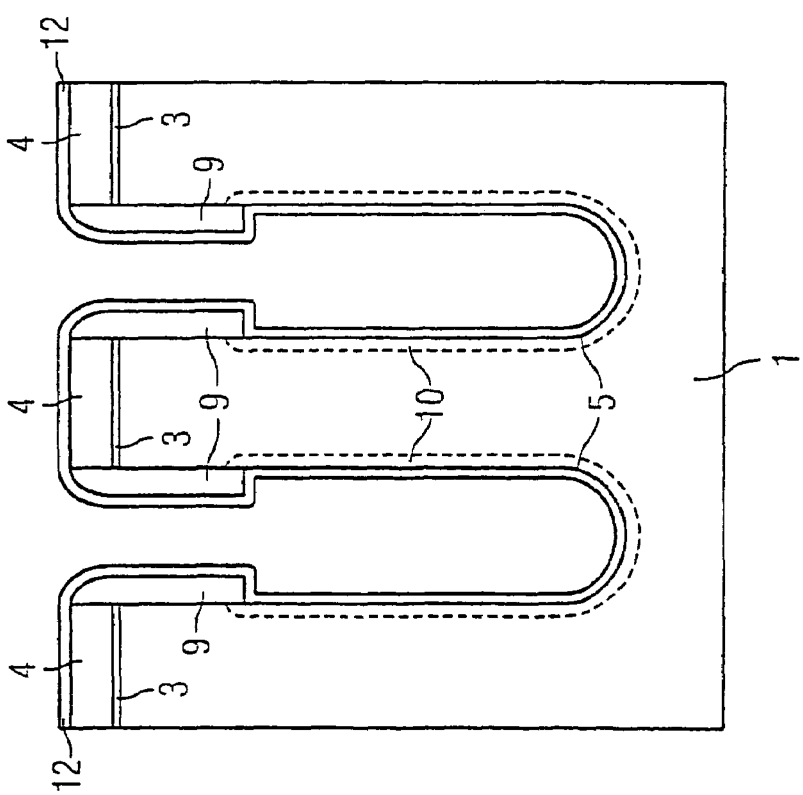

Next, a 5 nm thick dielectric layer 12, which contains $SiO_2$ and $Si_3N_4$ and also, if appropriate, silicon oxynitride, is deposited as a capacitor dielectric. The layer sequence can be realized by steps of nitride deposition and of thermal oxidation, in which defects in the layer below are annealed. As an alternative, the dielectric layer 12 contains $Al_2O_3$ (aluminum oxide), $TiO_2$ (titanium dioxide), $Ta_2O_5$ (tantalum oxide). In any event, the capacitor dielectric is deposited over the entire surface, so that it completely covers the trench 5 and the surface of the silicon nitride layer 4 (see FIG. 3).

Figure 4:
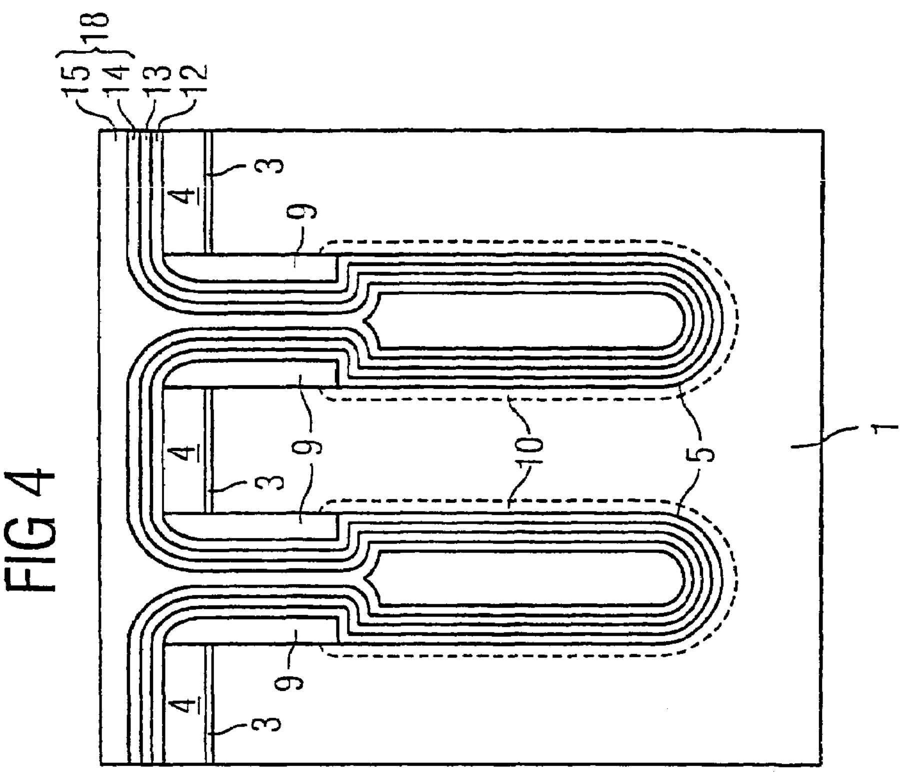

Then, the upper capacitor electrode 18 is formed in this exemplary embodiment, the upper capacitor electrode 18 contains three layers, namely a doped polysilicon layer 13 which is 20 nm thick, a tungsten silicide layer 14 which is 20 nm thick and an in-situ doped polysilicon layer 15 which is 200 nm thick, as illustrated in FIG. 4. In this case, the thickness of the first polysilicon layer 13 can also be reduced, or this layer can be omitted altogether. Since the insulating collar 9 has already been formed prior to the deposition of the dielectric layer 12 and of the upper capacitor electrode 18 in the upper part of the trench 5, the layers of the upper capacitor electrode 18 are deposited over the entire surface in the trench 5 and on the surface of the $Si_3N_4$ layer 4 by which are in general use.

As can be seen from FIG. 4, a cavity forms in the lower trench region during the deposition of the upper capacitor electrode 18. The cavity is advantageous with a view to further reducing the stress that is generated during deposition of the upper capacitor electrode.

Figure 5:
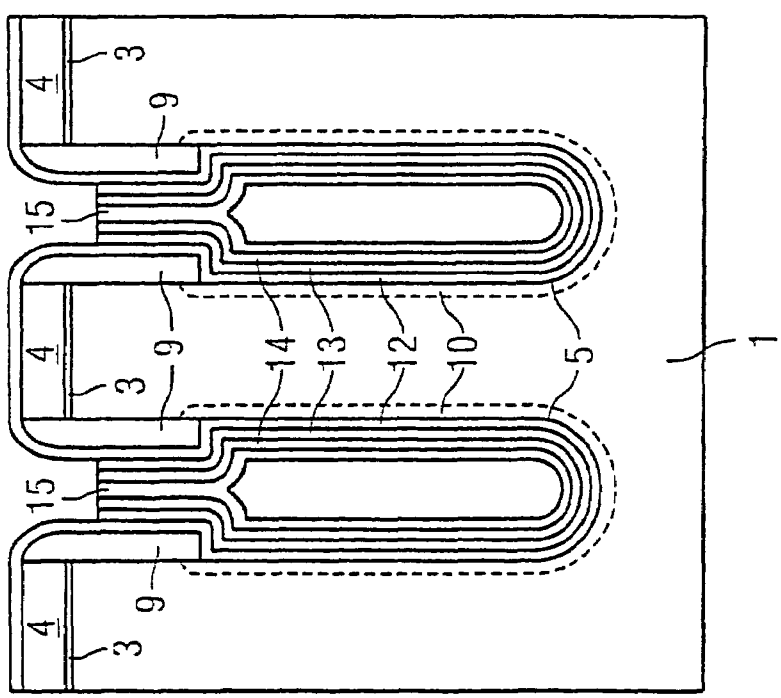

Next, the layers of the upper capacitor electrode 18 are etched back isotropically, for example by plasma etching using $SF_6$, with the result that the upper capacitor electrode is etched back to approximately 100 nm below the main surface 2, as shown in FIG. 5.

Figure 6:
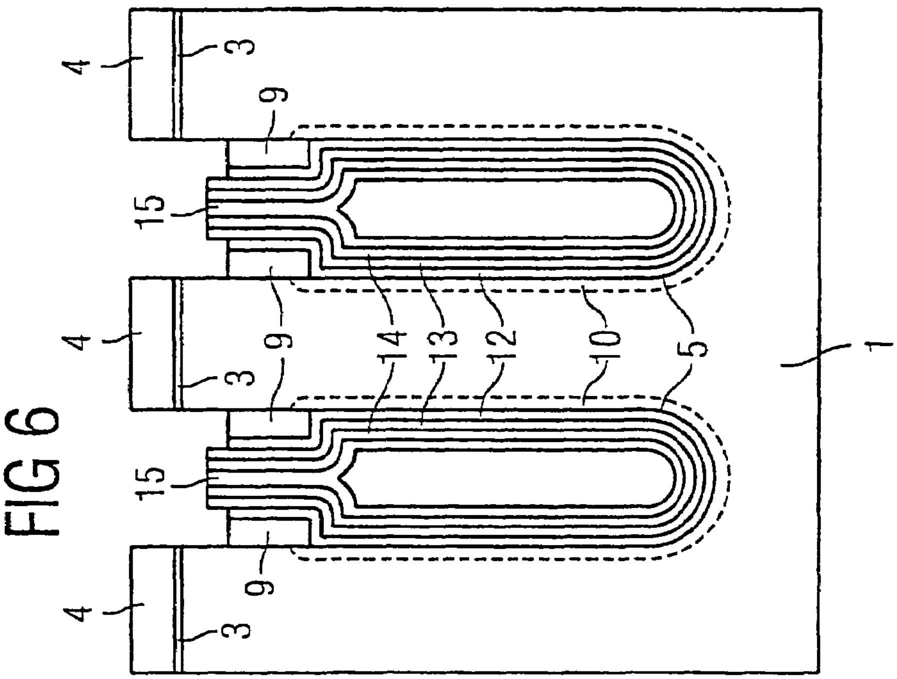

Then, the capacitor dielectric 12 and the oxide/nitride spacer layer 9 are etched back isotropically, so that the structure shown in FIG. 6 is formed. This can be achieved, for example, by wet-chemical etching using $H_3PO_4$ and HF. As can be seen clearly from FIG. 6, the layers of the upper capacitor electrode 18 extend beyond the upper edge of the insulating collar.

This makes it possible to achieve the advantage that the low-resistance metallic layer of the upper capacitor electrode is formed in a single piece, so that the conductivity of the upper capacitor electrode 18 is increased. Second, the polysilicon layers that have likewise been deposited reduce the stress at the insulator/metal interface.

Then, the standard DRAM process is carried out, by which the upper capacitor electrode 18 is suitably patterned and is connected to a source/drain region of a selection transistor. In the process, it is also, of course, possible for the selection transistor to be produced as a vertical transistor.

Figure 7:
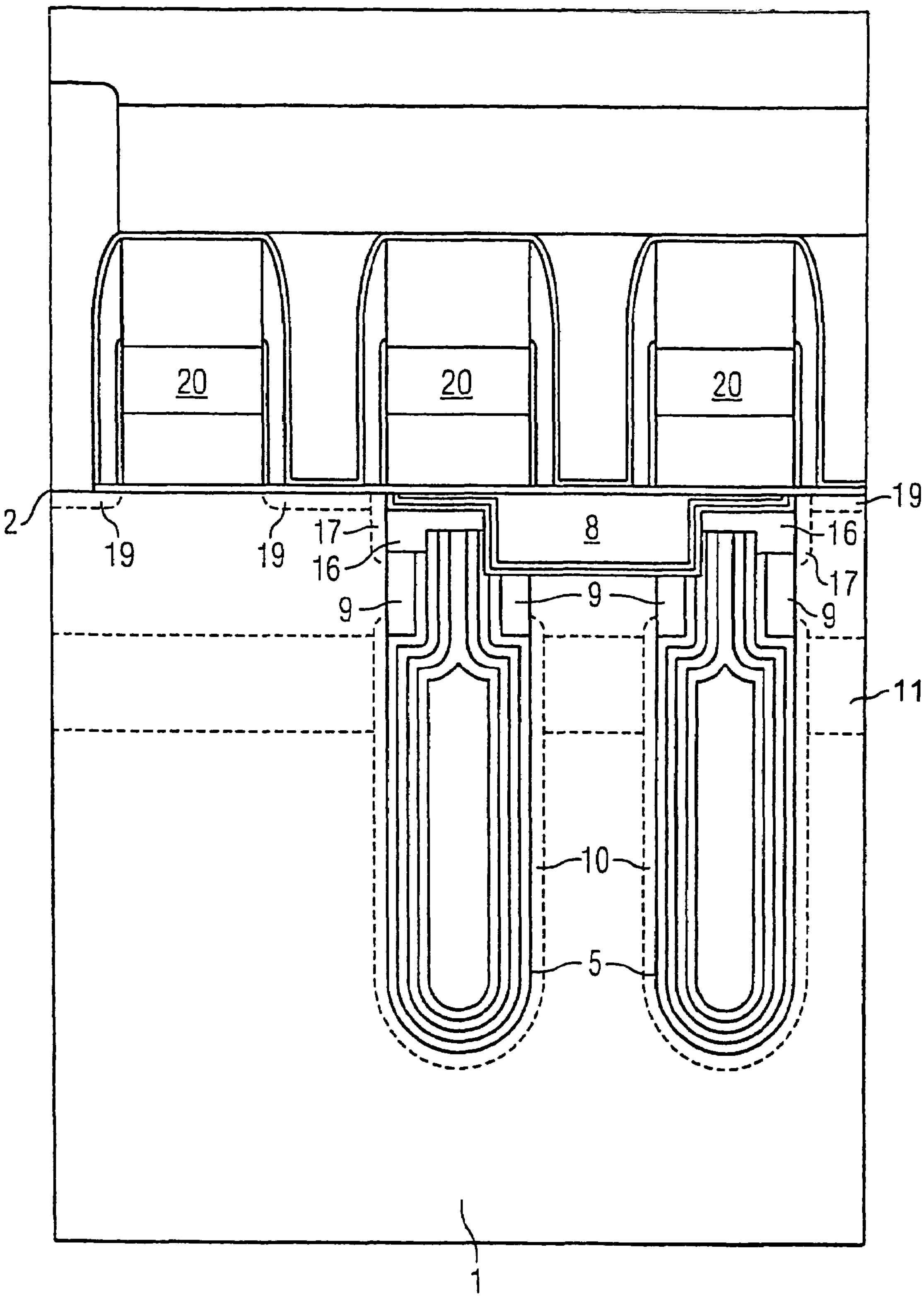

After a sacrificial oxidation step in order to form a non-illustrated screen oxide, an implantation is carried out, in which an $n^+$-doped region 17 is formed in the side wall of each trench 5 in the region of the main surface 2. As shown in FIG. 7, a free space that is left above the upper capacitor electrode 18 in the respective trench 5 is filled with a polysilicon filling 16 by deposition of polysilicon that is doped in situ and by etching back the polysilicon using $SF_6$. The polysilicon filling 16 acts as a connection structure between the $n_+$-doped region 17 and the upper capacitor electrode 18.

Next, insulating structures 8 are produced, which surround the active regions and thereby define these regions. For this purpose, a mask is formed, which defines the non-illustrated active regions. The insulating structures 8 are completed by non-selective plasma etching of silicon, $SiO_2$ and polysilicon with the aid of $CHF_3/N_2/NF_3$, the etching time being set in such a way that 200 nm of polysilicon are etched, by removal of the resist mask used by use of $O_2/N_2$, by wet-chemical etching of 3 nm of the dielectric layer, by oxidation and deposition of a 5 nm thick $Si_3N_4$ layer and by deposition of a 250 nm thick $SiO_2$ layer in a TEOS process and subsequent chemical mechanical polishing. Then, the $Si_3N_4$ layer 4 is removed by etching in hot $H_3PO_4$ and the $SiO_2$ layer 3 is removed by etching in dilute hydrofluoric acid.

Next, a screen oxide is formed by sacrificial oxidation. This step uses implantation stages and masks produced by photolithography in order to form n-doped wells, p-doped wells and to carry out threshold voltage implantations in the regions of the periphery and of the selection transistors of the cell array. Furthermore, a high-energy ion implantation is carried out in order to dope the substrate region which is remote from the main surface 2 in this way, an $n^+$-doped region 11, which connects adjacent lower capacitor electrodes 10 to one another, is formed (known as a "buried-well implant").

Next, the transistor is completed using generally known method steps, by in each case defining a gate oxide and gate electrodes 20, corresponding interconnects and source and drain electrode 19.

Then, the memory cell is completed in a known way by the formation of further wiring planes.

Figure 13:
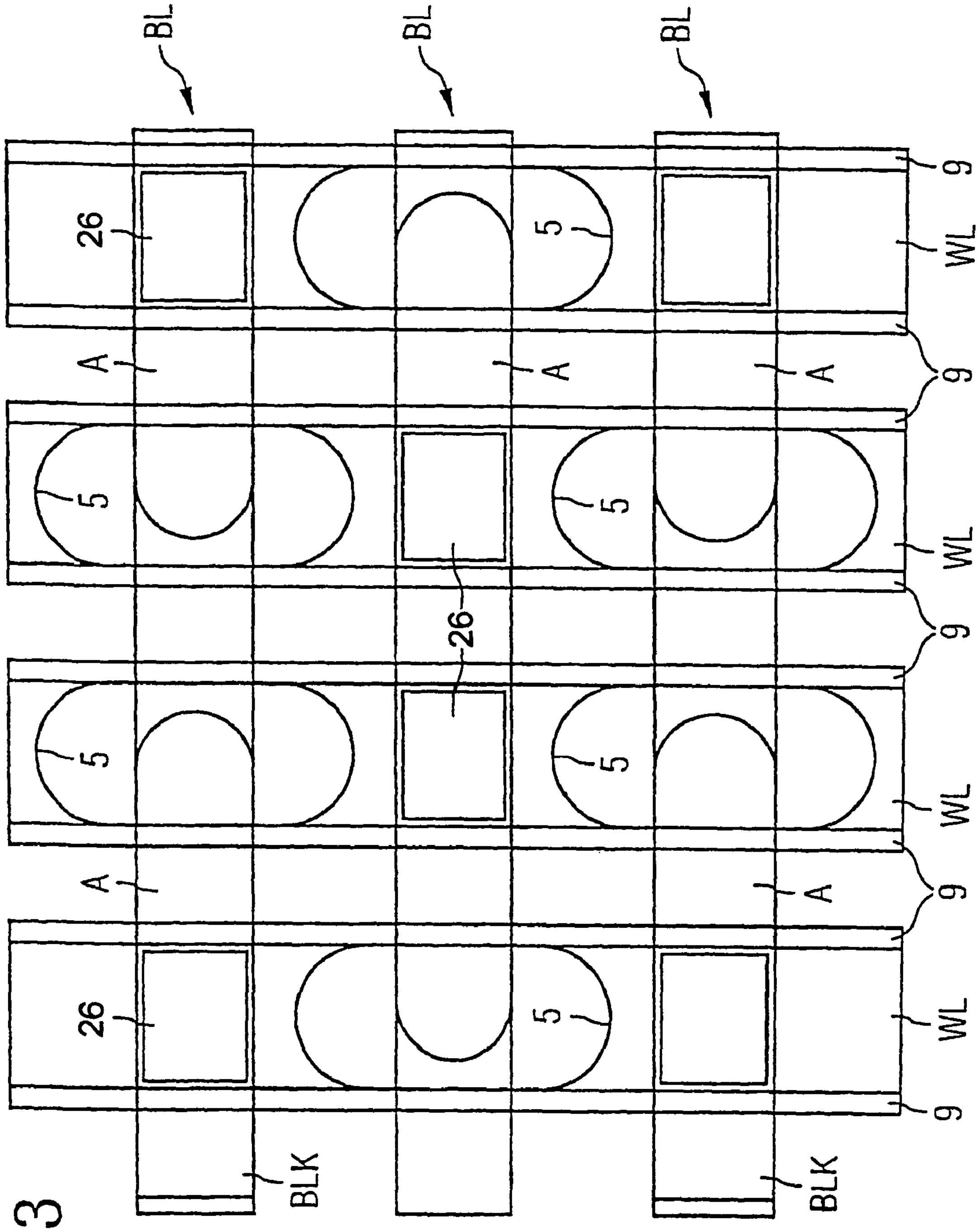
FIG. 13 is a plan view of a layout in an $8F^2$ cell architecture.

The memory cell configuration, the layout of which is illustrated by way of example for an $8F^2$ cell architecture in FIG. 13, has, for each memory cell, a storage capacitor disposed in one of the trenches 5 and a planar select transistor. Each memory cell takes up $8F^2$, where F is the minimum feature size in the corresponding technology. The bit lines BL run in strict form and parallel to one another, the width of the bit line BL in each case amounting to F and the distance between the bit lines likewise amounting to F. The word lines WL, which likewise have a width of F and are spaced apart by F, run perpendicular to this direction. Beneath the bit lines BL there are active regions A, two word lines WL crossing above each active region A. The active regions A are in each case disposed offset with respect to one another beneath adjacent bit lines BL. In the center of the active regions A there is a bit line contact BLK which allows electrical connection between the respective bit line BL and the active region A. The trenches 5 are disposed beneath the word line WL. The gate electrode 26 of the associated select transistor is in each case disposed within the active regions at the intersection point between one of the bit lines BL and one of the word lines WL.

The active regions A in each case extend between two trenches 5. They contain two select transistors, which are connected to the associated bit line BL via a common bit line contact BLK. Depending on which of the word lines WL is actuated, the information item is read from the storage capacitor that is disposed in one or other of the trenches 5.

Figure 8:
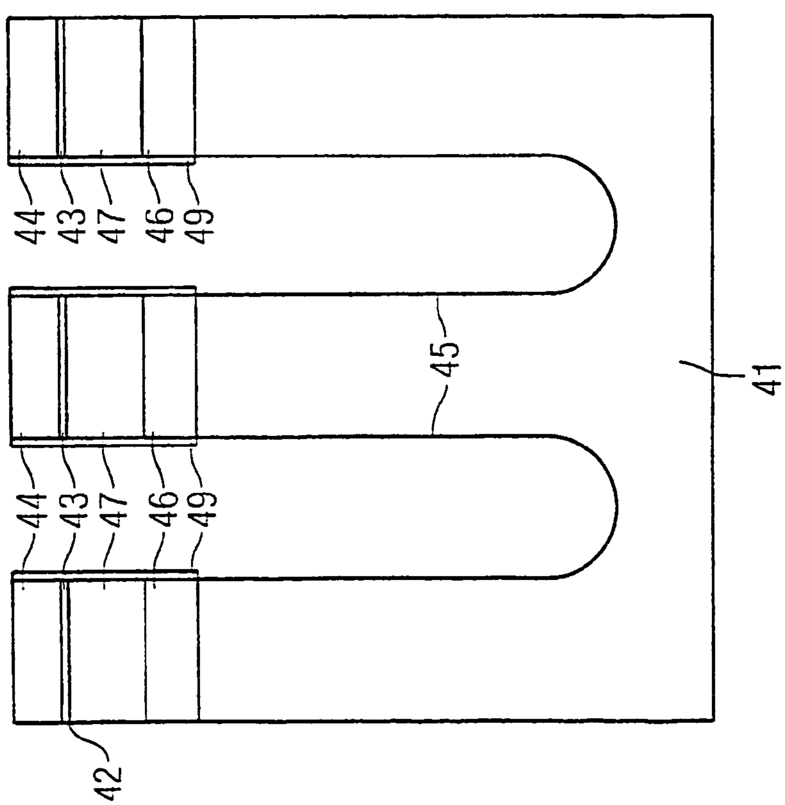

According to a further exemplary embodiment, as illustrated in FIG. 8, an SOI substrate 41, i.e. a silicon substrate with a buried $SiO_2$ layer 46, is used. An $SiO_2$ layer 43 having a thickness of 5 nm and a $Si_3N_4$ layer 44 having a thickness of 200 nm are applied to a main surface 42 of the SOI substrate 41. Above this, a non-illustrate BSG layer is deposited in a thickness of 1,000 nm, then a non-illustrated $Si_3N_4$ layer having a thickness of 200 nm and a non-illustrated polysilicon layer having a thickness of 350 nm, in each case functioning as a hard mask material. The polysilicon layer, the silicon nitride layer, the BSG layer and the nitride layer are etched by plasma etching using $CHF_3/O_2$ with the aid of a non-illustrated mask which is patterned by photolithography and defines the configuration of the storage capacitors. Then, an active Si layer 47 is etched by plasma etching using $HBr/NF_3$ and the buried oxide layer 46 is etched by plasma etching using $CHF_3/O_2$. The parameters of the etching step are such that the trenches are only etched as far as the lower end of the buried oxide layer 46.

After removal of the BSG hard mask, a 5 nm thick $Si_3N_4$ layer 49 is deposited as a spacer material. Since in this embodiment a parasitic transistor is avoided by the buried $SiO_2$ layer 46, the $Si_3N_4$ layer 49 in this case is not used to disconnect the parasitic transistor. Rather, its role is to prevent the diffusion of dopants during a subsequent step for doping of the substrate by doping from the vapor phase or from the doped $SiO_2$ layer in an upper capacitor region (active region 47). To achieve this, a thickness of 5 nm is sufficient. Then, capacitor trenches 45 are etched down to a depth of 5 $\mu$m by plasma etching using $HBr/NF_3$, as illustrated in FIG. 8. The capacitor trenches 45 have dimensions of, for example, 100×250 nm and are spaced apart from one another by 100 nm.

The etching of the capacitor trenches 45 may in this case take place in such a manner that the trenches 45 are widened in their lower region, i.e. in the region that is remote from the main surface 42. By way of example, a cross section can be widened by 40 nm in the lower region of the trench 45. In this way, the capacitor area and therefore the capacitance of the capacitor can be increased further.

The drawings illustrate the process sequence with unwidened trenches.

There then follows doping of the silicon substrate 41. This can be achieved, for example, by depositing an arsenic-doped silicate glass layer in a layer thickness of 50 nm and a TEOS-$SiO_2$ layer in a thickness of 20 nm, followed by a heat treatment step at 1,000° C., for 120 seconds, with the result that an $n^+$-doped region 50 is formed in the silicon substrate 41 by diffusion out of the arsenic-doped silicate glass layer. Alternatively, it is also possible to carry out vapor-phase doping, for example with the following parameters: 900° C., 399 Pa tributylarsine (TBA) (33 percent), 12 minutes.

The purpose of the $n^+$-doped region 50 is first to reduce the size of the depletion zone, with the result that the capacitance of the capacitor is increased further, and second, as a result of the high level of doping, the order of magnitude of approximately $10^{19}$ $cm^{-3}$, allows the lower capacitor electrode to be provided, if it is non-metallic. If it is metallic, the high level of doping produces an ohmic contact. The doping required for the ohmic contact is approximately $5\times10^{19}$ $cm^{-3}$.

Figure 9:
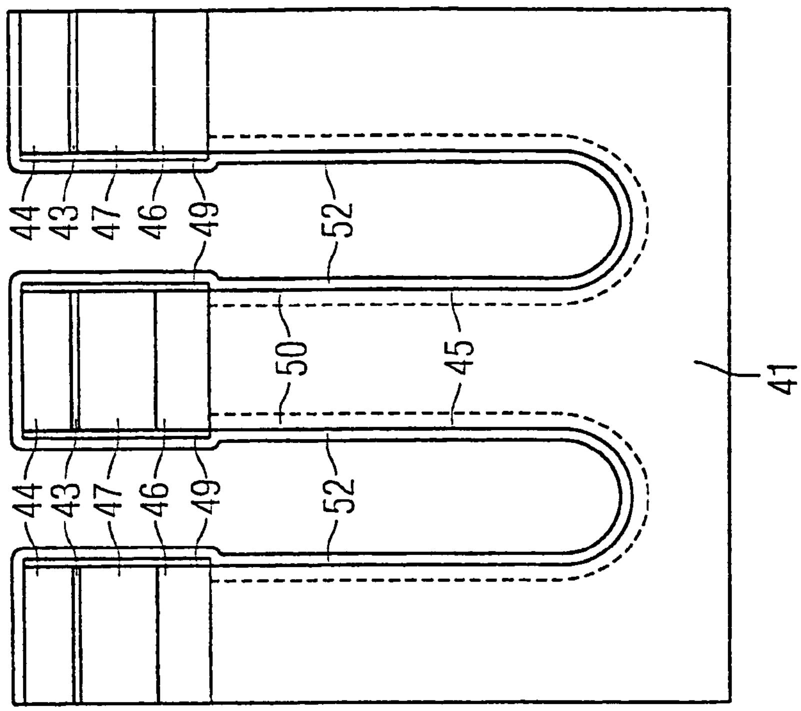
FIGS. 8 to 12 are sectional views showing the steps involved in fabricating the trench capacitor and the memory cell in accordance with a second embodiment of the invention.

Next, a 5 nm thick dielectric layer 52, which contains $SiO_2$ and $Si_3N_4$, and also, if appropriate, silicon oxynitride, is deposited as a capacitor dielectric. Alternatively, the dielectric layer 52 contains $Al_2O_3$ (aluminum oxide), $TiO_2$ (titanium dioxide), $Ta_2O_5$ (tantalum oxide). In any event, the capacitor dielectric 52 is deposited over the entire surface, so that it completely covers the trench 45 and the surface of the silicon nitride layer 44 (see FIG. 9).

Figure 10:
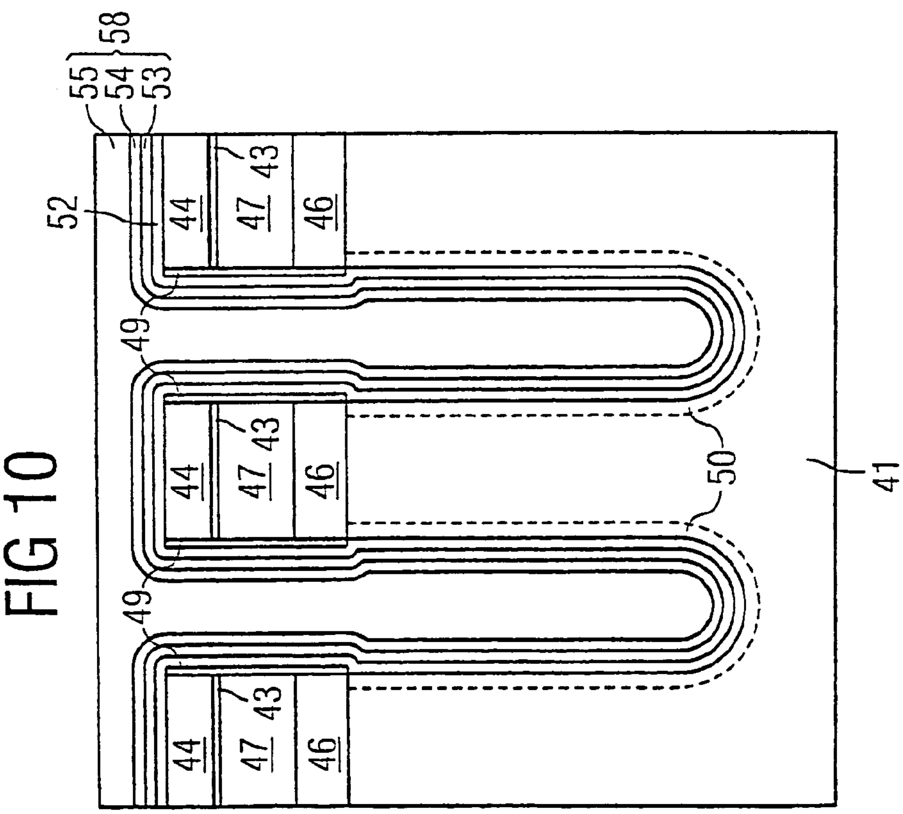
Figure 12:
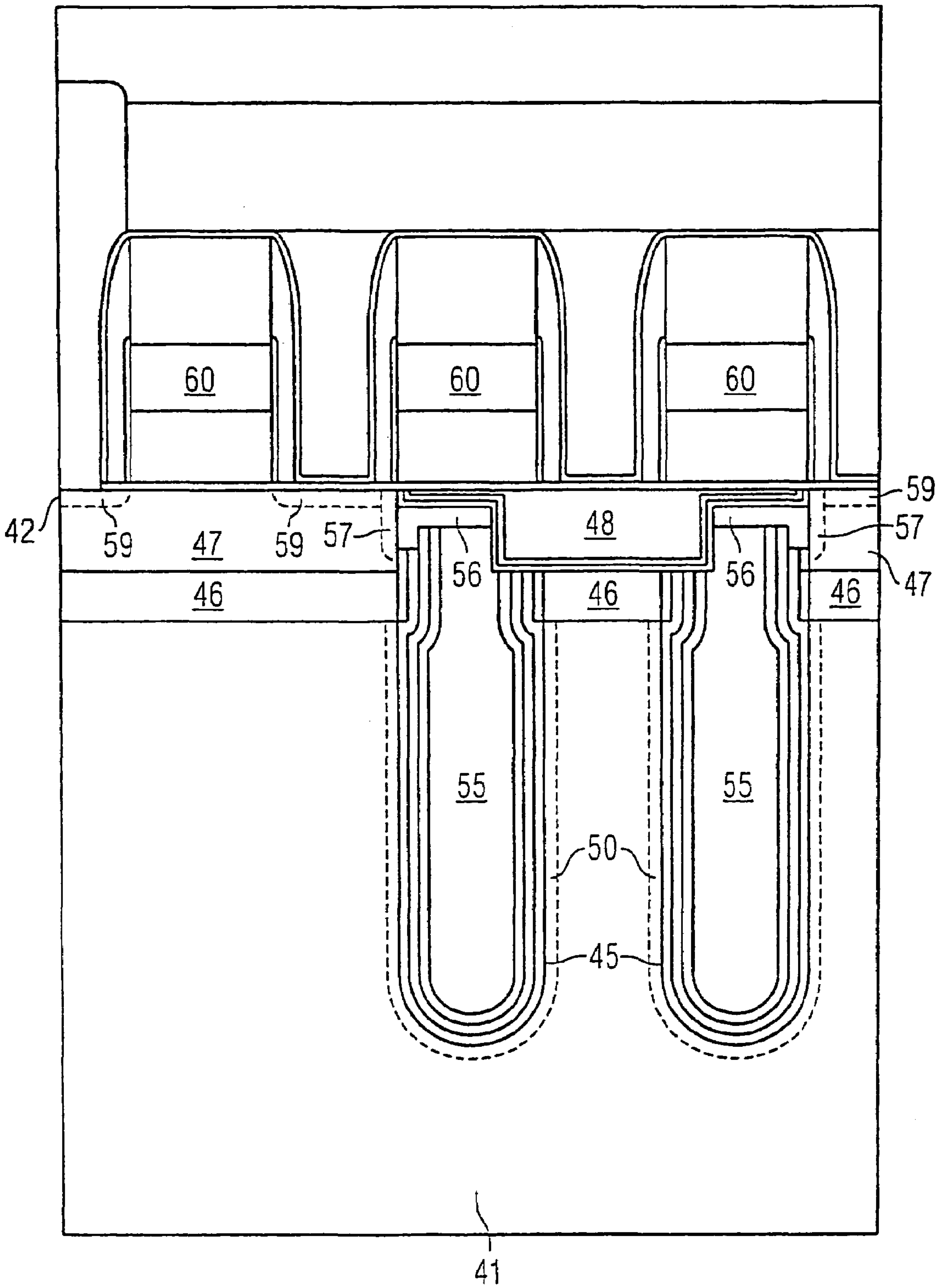

Then, an upper capacitor electrode 58 is formed in the exemplary embodiment, the upper capacitor electrode 58 contains three layers, namely a 20 nm thick doped polysilicon layer 53, a 20 nm thick tungsten silicide layer 54 and a 200 nm thick in-situ doped polysilicon layer 55, as illustrated in FIG. 10. In this case, the thickness of the first polysilicon layer 53 can also be reduced, or this layer can be omitted altogether. Since the spacer layer 49 is relatively thin (5 nm), there is no great constriction in the upper trench region, so that the second polysilicon layer 55 is deposited as a polysilicon filling, as can be seen from FIG. 10. The fact that the second polysilicon layer 55 is produced as a polysilicon filling allows the interfacial stress within the upper capacitor electrode to be minimized still further.

Since the spacer layer 49 has already been formed prior to the deposition of the dielectric layer 52 and of the upper capacitor electrode 58 in the upper part of the trench 45, the layers of the upper capacitor electrode 58 are deposited over the entire surface in the trench 45 and on the surf ace of the $Si_3N_4$ layer 44 by processes which are generally used.

Figure 11:
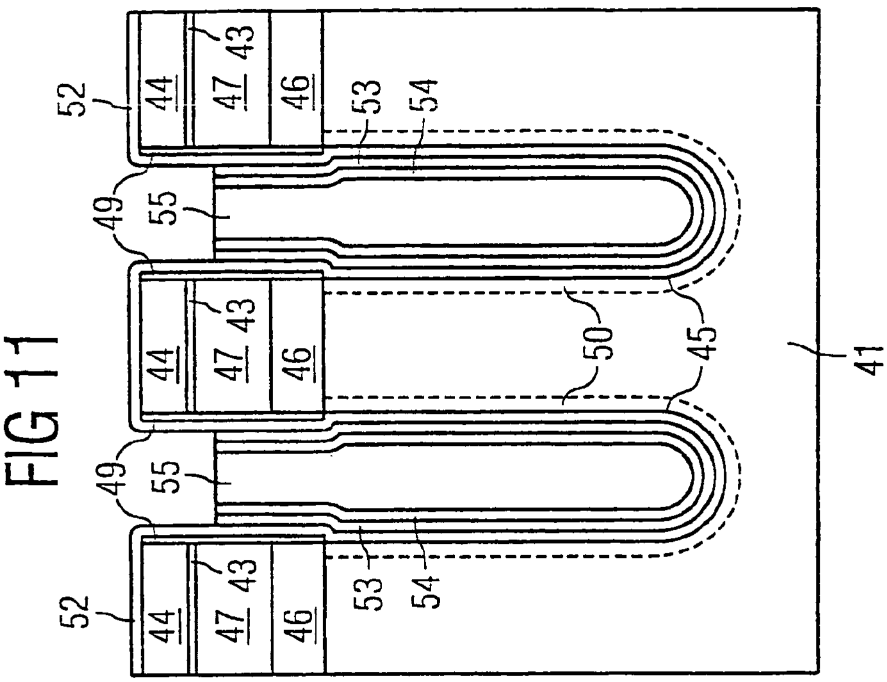

Then, the layers of the upper capacitor electrode 58 are etched back isotropically, for example by plasma etching using $SF_6$, with the result that the upper capacitor electrode is etched back to approximately 100 nm below the main surface 42, as shown in FIG. 11.

Then, the capacitor dielectric 52 and the nitride spacer layer 49 are etched back isotropically, for example by wet etching using $H_3PO_4$. Consequently, the layers of the upper capacitor electrode 58 extend beyond the upper edge of the insulating collar.

This makes it possible to achieve the advantage that the low-resistance metallic layer of the upper capacitor electrode is formed in a single piece, with the result that the conductivity of the upper capacitor electrode is increased.

Second, the polysilicon layers that are also deposited reduce the stress at the insulator/metal interface.

Next, the standard DRAM process is carried out, by which the upper capacitor electrode is suitably patterned and is connected to a source or drain electrode 59 of a select transistor. In the process, the select transistor may, of course, also be realized as a vertical transistor (see FIG. 11).

An $Si_3N_4$ etch using HF/ethylene glycol, in which 10 nm of $Si_3N_4$ are etched, and an etch using $NH_4F/HF$, which is used to etch $SiO_2$ and dielectric material, are carried out. After a sacrificial oxidation step to form a non-illustrated screen oxide, an implantation is carried out, in which an n-doped region 57 is formed in the side wall of each trench 45 in the region of the main surface 42. As shown in FIG. 11, space in the respective trench 45 that remains clear above the upper capacitor electrode 58 is filled with a polysilicon filling 56 by deposition of polysilicon that is doped in situ and by etching back the polysilicon using $SF_6$.

The polysilicon filling 56 acts as a connection structure between the $n^+$-doped region 57 and the upper capacitor electrode 58.

Then, insulation structures 48 are produced, which surround the active regions and thereby define these regions. For this purpose, a mask that defines the non-illustrated active regions is formed. The insulation structures 48 are completed by non-elective plasma etching of silicon, tungsten silicide, $SiO_2$ and polysilicon with the aid of $CHF_3/N_2/NF_3$, the etching time being set in such a way that 200 nm of polysilicon are etched, by removal of the resist mask used in this etching by means of $O_2/N_2$, by wet-chemical etching of 3 nm of dielectric layer, by oxidation and deposition of a 5 nm thick $Si_3N_4$ layer and by deposition of a 250 nm thick $SiO_2$ layer using a TEOS process and subsequent chemical mechanical polishing. Then, the $Si_3N_4$ layer 44 is removed by etching in hot $H_3PO_4$ and the $SiO_2$ layer 43 is removed by etching in dilute hydrofluoric acid.

Next, a screen oxide is formed by sacrificial oxidation. Implantations and masks that are produced by photolithography are used to form n-doped wells, p-doped wells and to carry out threshold voltage implantations in the regions of the periphery and the select transistors of the cell array. Furthermore, a high-energy ion implantation is carried out in order to dope the substrate region that is remote from the main surface 42. In this way, an $n^+$-doped region that connects adjacent lower capacitor electrodes 50 to one another is formed.

Next, the transistor is completed using generally known method, steps involving defining in each case a gate oxide and a gate electrodes 60, corresponding interconnects and the source and drain electrode 59.

Then, the memory cell is completed in a known way by forming further wiring planes.

We claim:

1. A trench capacitor for use in a DRAM memory cell, the trench capacitor comprising:

- a substrate having a substrate surface and a trench formed therein, said trench having a lower trench region, an upper trench region, a base, and walls;
- a lower capacitor electrode adjoining, in said lower trench region, one of said walls of said trench;
- a storage dielectric disposed at least partially in said trench;
- a spacer layer disposed in said upper trench region, said spacer layer adjoining one of said walls of said trench and made from an insulating material; and
- an upper capacitor electrode disposed at least partially in said trench, said upper electrode formed from at least three layers, said layers in each case extending along said walls and said base of said trench to at least an upper edge of said spacer layer, said layers including a first layer disposed in said trench on said storage dielectric and containing doped polysilicon, a second layer disposed on said first layer and containing metal-silicide, and a third layer disposed on said second layer and containing doped polysilicon.

2. The trench capacitor according to claim 1, wherein said substrate is a semiconductor substrate.

3. The trench capacitor according to claim 2, wherein said semiconductor substrate is a silicon substrate.

4. The trench capacitor according to claim 2, wherein said semiconductor substrate is a silicon-on-insulator substrate.

5. The trench capacitor according to claim 3, wherein said spacer layer has a thickness in a direction parallel to said substrate surface to be 15 to 25 nm.

6. The trench capacitor according to claim 4, wherein said spacer layer has a thickness in a direction parallel to said substrate surface to be 3 to 7 nm.

7. The trench capacitor according to claim 1, wherein said spacer layer is disposed in an upper third to an upper fifth of said trench and does not extend as far as said substrate surface.

8. The trench capacitor according to claim 1, wherein said second layer contains a metal selected from the group consisting of tungsten, titanium, molybdenum, tantanium, cobalt, nickel, niobium, platinum, palladium and rare earths.

9. A memory cell, comprising:

a substrate having a substrate surface and a trench formed therein, said trench having a lower trench region, an upper trench region, a base, and walls;

a trench capacitor, including:

a lower capacitor electrode adjoining, in said lower trench region, one of said walls of said trench;

a storage dielectric disposed at least partially in said trench;

a spacer layer disposed in said upper trench region, said spacer layer adjoining one of said walls of said trench and made from an insulating material;

an upper capacitor electrode disposed at least partially in said trench, said upper electrode formed from at least two layers, said layers in each case extending along said walls and said base of said trench to at least an upper edge of said spacer layer, said layers having a first layer disposed in said trench on said storage dielectric and containing doped polysilicon, a second layer disposed on said first layer and containing metal-silicide, and a third layer disposed on said second layer and containing doped polysilicon; and a selection transistor supported by said substrate and having a source electrode, a drain electrode, a gate electrode and a conductive channel, said upper capacitor electrode connected in an electrically conductive manner to one of said source electrode and said drain electrode.

* * * * *